(12) United States Patent
LeMaitre et al.

(10) Patent No.: US 9,453,723 B1
(45) Date of Patent: Sep. 27, 2016

(54) METHOD FOR TESTING A PHOTONIC INTEGRATED CIRCUIT INCLUDING A DEVICE UNDER TEST

(71) Applicant: STMICROELECTRONICS (CROLLES 2) SAS, Crolles (FR)

(72) Inventors: Patrick LeMaitre, Biviers (FR); Jean-Francois Carpentier, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/754,747

(22) Filed: Jun. 30, 2015

(51) Int. Cl.
*G01B 11/26* (2006.01)
*G01B 11/27* (2006.01)

(52) U.S. Cl.
CPC .................................. *G01B 11/27* (2013.01)

(58) Field of Classification Search
CPC ........... G02B 6/00; G02F 1/00; H01L 31/00; H01L 27/00; H04J 14/00
USPC .................. 356/237.2–237.6, 399, 479, 153; 385/137, 37, 33
See application file for complete search history.

(56) References Cited

U.S. PATENT DOCUMENTS

| | | | |
|---|---|---|---|
| 5,056,915 A * | 10/1991 | Curtis | G01M 11/3172 250/227.25 |
| 6,408,120 B1 | 6/2002 | Dautartas | |
| 6,754,428 B1 | 6/2004 | Brown et al. | |
| 6,819,858 B2 | 11/2004 | Steinberg et al. | |
| 6,947,147 B2 | 9/2005 | Motamedi et al. | |
| 7,027,154 B2 * | 4/2006 | Yuan | G02B 6/4226 356/399 |
| 7,184,626 B1 | 2/2007 | Gunn, III et al. | |
| 7,378,861 B1 | 5/2008 | Malendevich et al. | |
| 7,460,983 B2 | 12/2008 | Pickerd et al. | |
| 7,548,682 B2 | 6/2009 | Last et al. | |
| 8,077,314 B2 * | 12/2011 | Davies | G01K 11/32 356/344 |
| 8,618,826 B2 * | 12/2013 | Cho | G01R 31/2846 257/48 |
| 8,907,696 B2 | 12/2014 | Masuda | |
| 2004/0201383 A1 * | 10/2004 | Anderson | G01R 27/32 324/600 |
| 2006/0056310 A1 * | 3/2006 | Daniel | G01R 27/28 370/252 |
| 2007/0276614 A1 | 11/2007 | Tan et al. | |
| 2011/0026882 A1 | 2/2011 | Budd et al. | |
| 2013/0005606 A1 * | 1/2013 | Chakravarty | G01N 21/253 506/9 |
| 2013/0176554 A1 * | 7/2013 | Loncar | B82Y 20/00 356/51 |

OTHER PUBLICATIONS

Arnold et al., "Set the Pace on the Data Highway," Physics' Best, Apr. 2014, 3 pages.

* cited by examiner

*Primary Examiner* — Tarifur Chowdhury
*Assistant Examiner* — Isiaka Akanbi
(74) *Attorney, Agent, or Firm* — Allen, Dyer, Doppelt, Milbrath & Gilchrist, P.A.

(57) ABSTRACT

A method is for testing a photonic integrated circuit (IC) that includes a test structure having a test optical splitter, a test optical input, and first and second test optical outputs. A device under test (DUT) is coupled between the first test optical output and the first output of the test optical splitter. The deembedding structure includes a deembedding optical splitter, a deembedding optical input and first and second deembedding optical outputs. The method includes coupling a test probe device to the test optical inputs and outputs and the deembedding optical inputs and outputs and operating the test probe device to make at least one test measurement related to the DUT and at least one deembedding measurement. The at least one test measurement is processed with the at least one deembedding measurement to determine whether the DUT is acceptable and independent of alignment error.

20 Claims, 6 Drawing Sheets

278
METHOD FOR TESTING A PHOTONIC INTEGRATED CIRCUIT INCLUDING A DEVICE UNDER TEST

TECHNICAL FIELD

The present invention relates to the field of photonics and, more particularly, to testing a photonic integrated circuit (IC) including a device under test.

BACKGROUND OF THE INVENTION

Integrated optical devices for directly processing optical signals have become of greater importance as optical fiber communications increasingly replace metallic cable and microwave transmission links. Integrated optical devices can advantageously be implemented as silica optical circuits having compact dimensions at relatively low cost. Silica optical circuits employ integrated waveguide structures formed on silicon substrates.

In some applications, optical gratings are formed in the silicon substrate or chip for input-output of the photonic signal. Typically, the optical grating is formed as a grating coupler on a major surface of the silicon substrate and connects via optical circuits to an integrated optical device, for example, an optical multiplexer or demultiplexer as a passive device or optical amplifier as an active device.

During manufacture, the integrated optical devices are typically tested as a device under test (DUT) using a test probe device to determine whether the DUT is acceptable or should be rejected. Passive devices typically have been measured by cascading a large number of DUTs so that the power loss of the cascaded DUTs is large enough compared to any loss at the grating couplers resulting from misalignment of the test probe device onto the grating couplers. This has been found expensive and cumbersome since many DUTs are typically cascaded.

SUMMARY OF THE INVENTION

A method of testing a photonic integrated circuit (IC) comprises a test structure and a deembedding structure, the test structure comprising a test optical splitter, a test optical input coupled to an input of the test optical splitter, first and second test optical outputs coupled to respective first and second outputs of the test optical splitter, and a device under test (DUT) coupled between the first test optical output and the first output of the test optical splitter. The deembedding structure comprises a deembedding optical splitter, a deembedding optical input coupled to an input of the deembedding optical splitter, and first and second deembedding optical outputs coupled to respective first and second outputs of the deembedding optical splitter. The method may include initially coupling a test probe device to the test optical input, first and second test optical outputs, and then the deembedding optical input, and first and second deembedding optical outputs. The method may include operating the test probe device to make at least one test measurement related to the DUT, and at least one deembedding measurement, and processing the at least one test measurement and the at least one deembedding measurement to thereby determine whether the DUT is acceptable and independent of alignment error.

The photonic IC may be from among a plurality thereof contained on a semiconductor wafer. Operating the test probe device may comprise transmitting an optical signal to the test optical input and the deembedding optical input. Operating the test probe device may comprise receiving optical signals from the first and second test optical outputs and the first and second deembedding optical outputs.

In other embodiments, the coupling of the test probe device comprises coupling an array of optical fibers to respective grating couplers on the photonic IC. The test optical splitter and deembedding optical splitter may have a common splitting ratio. The common splitting ratio may be 50/50. The photonic IC further may comprise electronic circuitry coupled to the DUT.

In another embodiment, a test probe device for testing a photonic integrated circuit (IC) comprises a test structure and a deembedding structure, the test structure comprising a test optical splitter, a test optical input coupled to an input of the test optical splitter, first and second test optical outputs coupled to respective first and second outputs of the test optical splitter, and a device under test (DUT) coupled between the first test optical output and the first output of the test optical splitter. The deembedding structure comprises a deembedding optical splitter, a deembedding optical input coupled to an input of the deembedding optical splitter, and first and second deembedding optical outputs coupled to respective first and second outputs of the deembedding optical splitter. The test probe device may comprise a plurality of optical fibers to be temporarily coupled to the test optical input, first and second test optical outputs, the deembedding optical input, and first and second deembedding optical outputs. At least one optical transmitter and a plurality of optical receivers may be coupled to the plurality of optical fibers and configured to make at least one test measurement related to the DUT and at least one deembedding measurement. A processor may be coupled to the at least one optical transmitter and plurality of optical receivers and configured to process the at least one test measurement and the at least one deembedding measurement to thereby determine whether the DUT is acceptable and independent of alignment error.

In yet another embodiment, a photonic integrated circuit (IC) may comprise a test structure comprising a test optical splitter, a test optical input coupled to an input of the test optical splitter, first and second test optical outputs coupled to respective first and second outputs of the test optical splitter, and a device under test (DUT) coupled between the first test optical output and the first output of the test optical splitter. A deembedding structure may comprise a deembedding optical splitter, a deembedding optical input coupled to an input of the deembedding optical splitter, and first and second deembedding optical outputs coupled to respective first and second outputs of the deembedding optical splitter. The test optical input, first and second test optical outputs, the deembedding optical input, and first and second deembedding optical outputs may be configured to be temporarily coupled to a test probe device to make at least one test measurement related to the DUT, and at least one deembedding measurement to thereby determine whether the DUT is acceptable and independent of alignment error.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
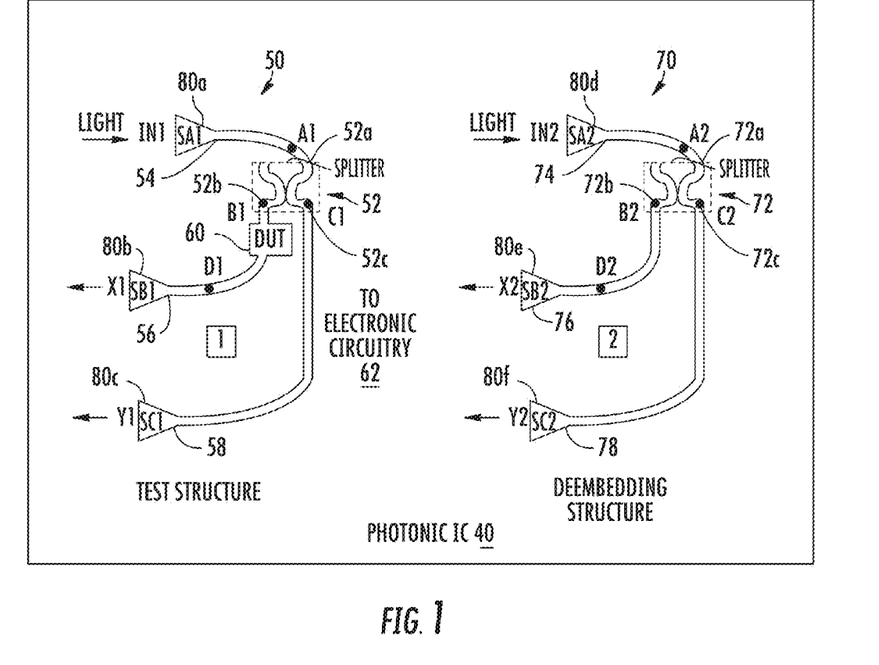
FIG. 1 is a schematic diagram of an example photonic IC having a test structure and deembedding structure, according to the present disclosure.

A method of testing a photonic integrated circuit (IC), according to the present disclosure, is now described with reference to the structures shown in FIGS. 1-5 and the flowchart of FIG. 6. The photonic IC is illustrated generally at 40 in FIGS. 1, 3 and 4, and in this example, may be contained on a semiconductor wafer 42 (FIG. 4). The photonic IC 40 includes a test structure 50 and deembedding structure 70. The test structure 50 includes a test optical splitter 52 and a test optical input 54 coupled to an input 52a of the test optical splitter 52. First and second test optical outputs 56, 58 are coupled to respective first and second outputs 52b, 52c of the test optical splitter 52. A device under test (DUT) 60, for example, a cascaded band waveguide, is coupled between the first test optical output 56 and first output 52b of the test optical splitter 52. Electronic circuitry 62 may be connected to the DUT 60, for example, transceivers and associated devices, as best shown in FIG. 1.

The deembedding structure 70 includes a deembedding optical splitter 72 and a deembedding optical input 74 coupled to an input 72a of the deembedding optical splitter 72. First and second deembedding optical outputs 76, 78 are coupled to respective first and second outputs 72b, 72c of the deembedding optical splitter 72. Each of the test optical inputs and outputs 54, 56, 58 and deembedding optical input and outputs 74, 76, 78 are coupled to respective grating couplers 80a-f on the photonic IC 40, and configured to be temporarily coupled to a test probe device 100 (FIGS. 3 and 4) having an array 102 of optical fibers, which may be temporarily coupled to the grating couplers 80a-c and then 80d-f, and thus, temporarily coupled to the test optical input 54, first and second test optical outputs 56, 58, and in a subsequent measurement to the deembedding optical input 74, and the first and second deembedding optical outputs 76, 78. The test probe device 100 makes at least one test measurement related to the DUT 60 and at least one deembedding measurement to determine whether the DUT is acceptable independent of alignment error that occurs between the grating couplers 80a-f and the array 102 of optical fibers.

Figure 2:
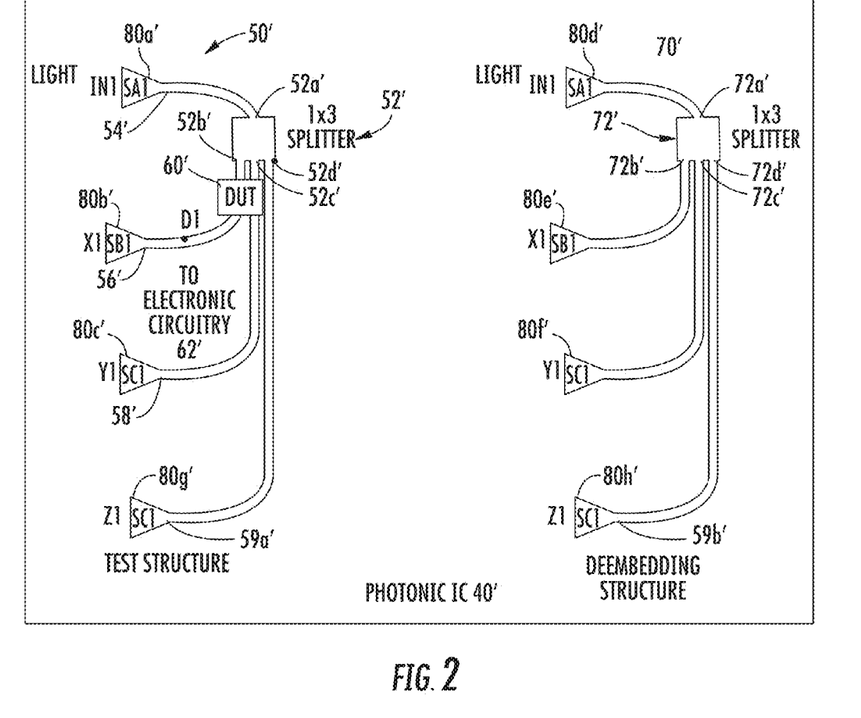
FIG. 2 is a schematic diagram of another embodiment of the photonic IC, according to the present disclosure.

FIG. 2 shows another embodiment of the photonic IC 40' and having a two output DUT 60' with the test structure having an additional output 59a' and optical grating 80g'. The deembedding structure includes another output 59b' and optical grating 80h'. The splitters 52', 72' for the structures are 1 by 3 optical splitters in this example. Generally, for an N output DUT, the optical splitter is a 1×(N+1) splitter. The additional output for the splitter is shown at 52d' and 72d' for the respective test structure 50' and deembedding structure 70'.

As in FIG. 6, the method is illustrated generally at the flowchart 120 and the process starts (Block 122) and includes coupling the test probe device 100 to the test optical input 54, first and second test optical outputs 56, 58, and subsequently to the deembedding optical input 74, and first and second deembedding optical outputs 76, 78 (Block 124). The method further includes operating the test probe device 100 to make at least one test measurement related to the DUT 60, and when coupled to the deembedding structure, make at least one deembedding measurement (Block 126).

As further illustrated, the method includes processing the at least one test measurement and the at least one deembedding measurement to thereby determine whether the DUT 60 is acceptable and independent of alignment error (Block 128) and then ends (Block 130). Electronic circuitry is coupled to the DUT. In an example, electronics may include transceivers and associated devices.

Figure 3:
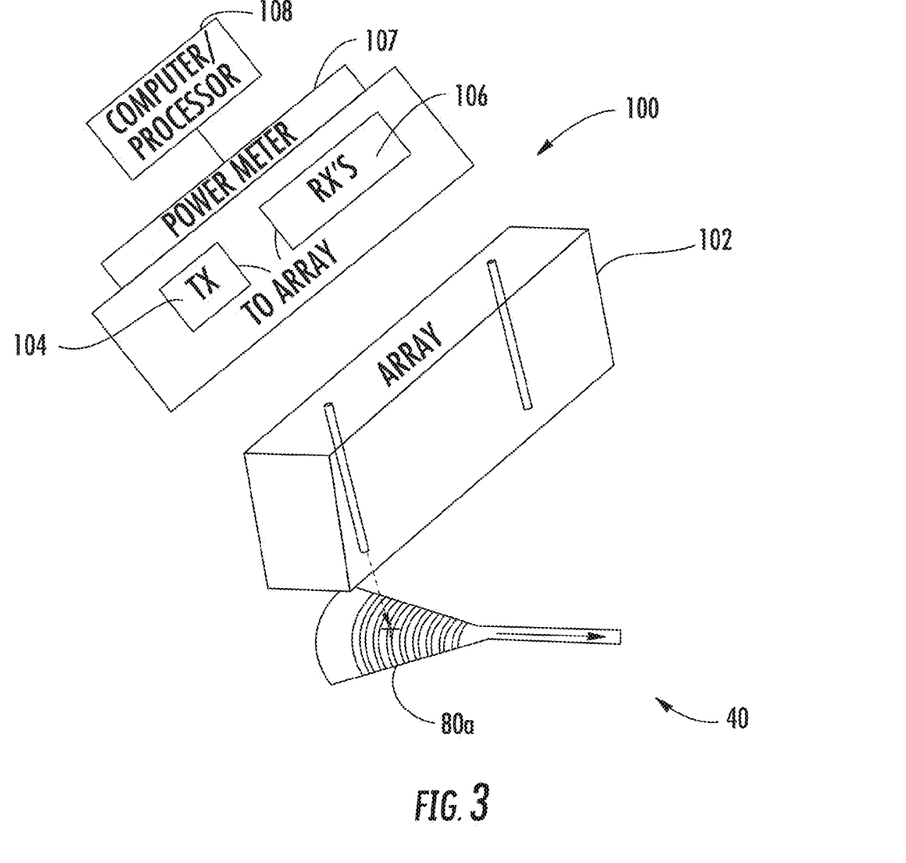
FIG. 3 is a schematic, partial isometric view of the test probe device positioned adjacent an optical grating, according to the present disclosure.
Figure 4:
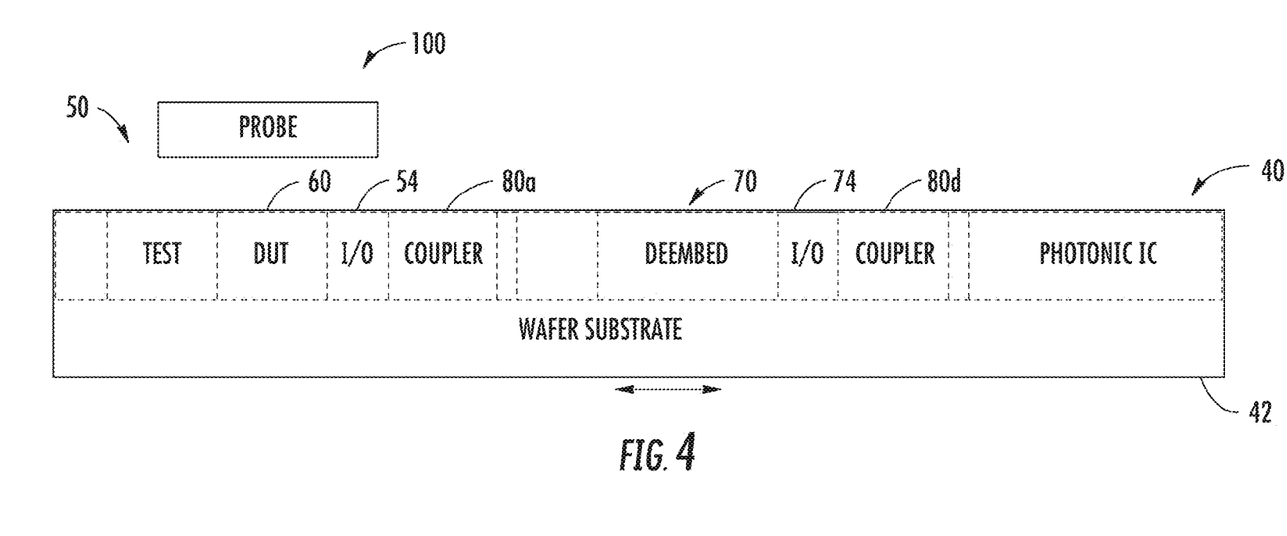
FIG. 4 is a schematic side elevation view of the photonic IC showing the test structure and deembedding structure and a test probe device, according to the present disclosure.

Referring to FIG. 3, the test probe device 100 transmits an optical signal to the test optical input 54 and the deembedding optical input 74 and receives optical signals from the first and second test optical outputs 56, 58 and then the first and second deembedding optical outputs 76, 78. The test probe device 100 includes the array 102 of optical fibers that are coupled to the respective grating couplers 80a-c and 80d-f on the photonic IC 40. The test probe device 100 includes at least one optical transmitter 104 and a plurality of optical receivers 106 coupled to the array 102 of optical fibers.

A power meter 107 connects to the optical receivers 106 and measure the power. A separate computer that includes a processor 108 is connected to the probe device 100. The processor 108 could be integral with the structure holding the array 102 or separate. The photonic IC 40 and wafer on substrate 42 may be supported on a Thorlabs five (5) axis probe support to move in an X, Y, yaw, pitch, and roll direction. The array 102 of optical fibers as part of the probe 100 are connected to a laser as part of the transmitter 104 in this example and the power meter 107 as part of the receivers 106. The wafer 42 contains the photonic device 40 and is supported on a "chuck" (not shown) and can move in the X and Y direction while the laser source as part of the transmitter 104, power meter 107 and other components is controlled by the computer 108. The wafer or substrate 42 is moved so that the probe 100 with the array 102 is positioned above the structure to measure and move the wafer with a few micrometer (μm) resolution. There is an alignment procedure to optimize the position of the fiber array down to about 10 nanometer accuracy and maximize the optical power between two ports. At least one test measurement related to the DUT 60 is made and at least one deembedding measurement made, and the processing at the computer determines if the DUT is acceptable. FIG. 4 shows a sectional view with the various structures and the probe 100. The wafer or substrate 42 will be moved to position the DUT and its input/output under the probe and then move and position the deembedding structure under the probe 100.

Figure 5:
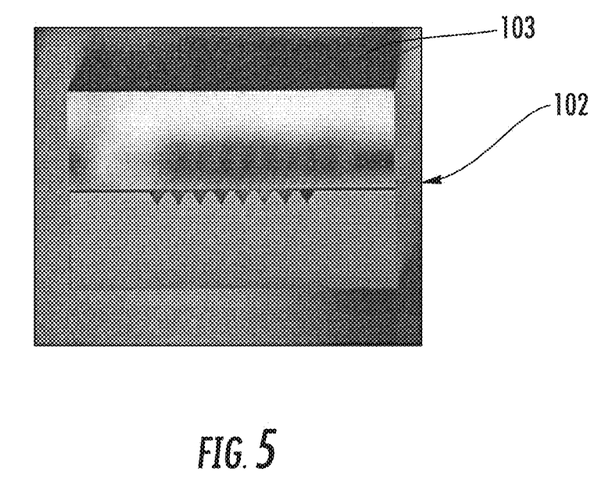
FIG. 5 is a schematic and partial isometric view of an optical fiber array, according to the present disclosure.
Figure 6:
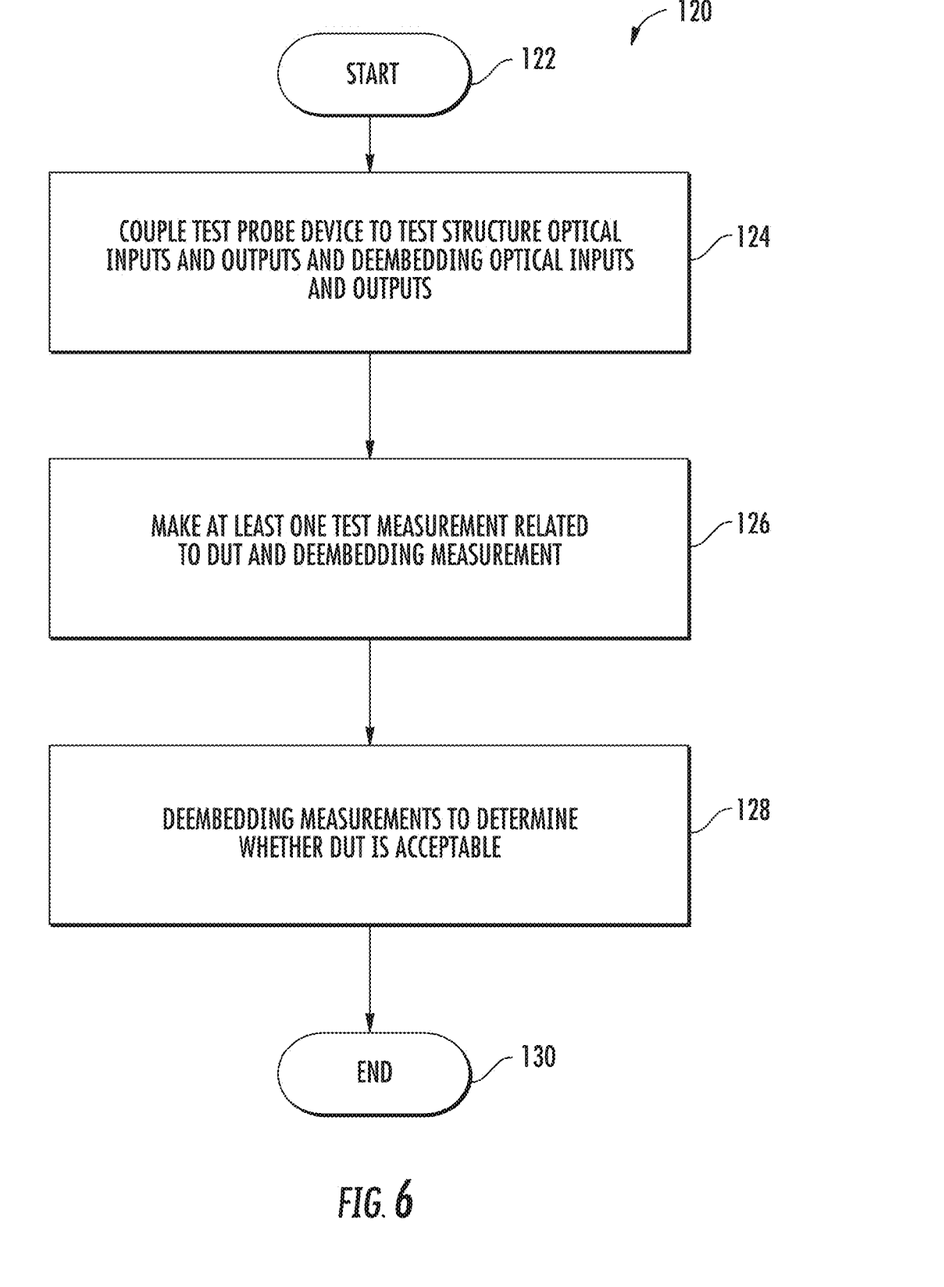
FIG. 6 is a flowchart illustrating an operation of a method for testing a photonic IC having a DUT, according to the present disclosure.

An example of the optical fiber array 102 that could be used is shown in FIG. 5. A plurality of optical fibers can be held within a support structure 103. The wafer or substrate 42 will move by means of the chuck supporting the wafer. When the fiber array 102 is above the structure, it may test to within a few micrometer (μm) accuracy. The optical alignment in X and Y occurs with high accuracy of about 10 nanometer (nm) to optimize the output power between the input and one of the outputs. The fiber array can move in X and Y and the power versus lambda is measured. For a group of DUTs that are placed close to each other such as less than 1 to about 10 mm within a die, for example, a 300 mm die, only one deembedding structure may have to be measured. For example, there may be one deembedding structure per type of DUT.

In a preferred embodiment, the test optical splitter 52 and deembedding optical splitter 72 have a common splitting ratio such as 50/50. In another example, the test optical splitter 52 and deembedding optical splitter 72 are formed to have a splitting ratio such that a greater amount of optical power is transmitted into the DUT 60, which enhances measurement accuracy in those cases where the DUT absorbs excessive optical energy and would be more prone to error measurements. An example could be a passive device for the DUT such as a multiplexer with many signal paths that would be more prone to error resulting from optical misalignment.

Different optical splitters could be used as long as the splitting ratio for the test optical splitter 52 and deembedding optical splitter 72 are the same and have similar power loss. For example, the optical splitters could be formed as a multimode interference (MMI) splitter or a Y-junction splitter. DC coupler optical splitters could also be used. A Y-junction optical splitter may be formed as a branching waveguide structure.

Different operating wavelengths may be used for the optical signal from the test probe device 100 to the test optical input 54 and deembedding optical input 74. These operating wavelengths may vary depending on the design of the DUT 60 and its operating wavelength. The optical grating couplers 80a-f may be formed using conventional techniques known to those skilled in the art and, in an example, could be formed as 10 micrometer wide waveguides with an adiabatic tapers to allow coupling to single mode optical fibers. Each grating coupler 80a-f may use a surface-coupling technique to couple light efficiently between a waveguide and a standard single-mode optical fiber. Waveguide gratings diffract light into a silicon waveguide and output from the waveguide to an optical fiber, such as part of the test probe device 100. Vertical fiber couplings may be used with linearly chirped gratings to reduce back-reflection to obtain a coupling efficiency similar to the more conventional angled alignment approach. It is possible to use an apodized grating coupler that is fabricated by electron beam lithography and a sub-wavelength grating coupler that can be fabricated by a similar etch step as the waveguides. Polarization-independent coupling can be achieved using sub-wavelength structures.

The DUT 60 may be part of a high-speed communications circuit or a biochemical or motion sensor circuit as part of the coupled electronic circuitry 62. Different processes may be used to form various devices. A silicon substrate may include a buried oxide layer with different field oxides and silicide blocks and selective metal layers and contacts and may be formed using conventional techniques known to those skilled in the art. Example devices may include optical transceivers having a transmitter formed as a mach M-Zhender modulator with high-speed phase modulators (HSPM) based on carrier depletion and a receiver formed as a waveguide photodetector interface. The devices may form optical interconnects used with cloud data centers.

Several optimizations are possible for comparing at least one test measurement and the at least one deembedding measurement to determine whether the DUT 60 is acceptable and independent of alignment error. In an example explained below, the coupling coefficient is the splitting ratio of the test and deembedding optical splitters 52, 72, which is typically 50/50. Ki is the ratio between one input over the sum of all inputs and the assumption is made that K as the splitting ratio is identical between the test and deembedding structures 50, 70 (K1=K2) and the output of a grating coupler, typically formed as SPGC (Single Polarization Grating Coupler). This is shown in the formulae below as identical. Each grating coupler 80a-f has its own transfer function. It is assumed that the alignment for the grating couplers 80a-f relative to the array 102 of fibers on the test probe device 100 may not be the same as the probe descends onto the optical test structure 50 and deembedding structure 70. Thus, dissimilar transfer functions exist for the grating couplers 80a-c in the optical test structure 50 as compared to the grating couplers 80d-f in the deembedding structure 70. Because the output is measured at both the first and second test optical outputs for both the test and deembedding structure 50, 70 and the amount of light is known with the splitting ratio K, it is possible to determine the transfer function of the DUT 60 given in the formulae below as h(dut). Thus, the transfer function can be expressed as the function of the two outputs for both the test and deembedding structures 50, 70 and the splitting ratio.

Power transfer function for SPGC for i=1,2

$$h(sai)=ai/ini$$

$$h(sbi)=xi/di$$

$$h(sci)yi/ci \quad (1)$$

Cross coupling coefficient for lossless splitter:

$$ki=bi/ai, ri=(1-ki)=ci/ai \quad (2)$$

$$\text{Assumption 1 } h(sci)=h(sbi)=h(sai)$$

$$\text{Assumption 2 } k=k1=k2 \quad (3)$$

But:
$h(sa1) \neq h(sa2)$
$h(sb1) \neq h(sb2)$
$h(sc1) \neq h(sc2)$
On structure 2 for deembedding (k measurement):

$$(1) \text{ and } (2) \text{ give } b2=k/1-k; c2=k/1-k \cdot y2/h(sc2) \quad (6)$$

Since d2=b2, 1−k/k=y2/x2 thus, k=x2/y2+x2
On structure 1 (dut measurement):

$$\text{Power transfer function of DUT } h(\text{dut})=d1/b1 \quad (5)$$

$$(1) \text{ and } (2) \text{ give } b1=k/1-k \; c1=k/1-k \cdot y1/h(sc1)$$

$$(3), (5) \text{ and } (6) \text{ give } h(\text{dut})=1-k/k \cdot (x1/y1) \quad (6)$$

In dB Loss(dut)=X1+R−K−Y1
For a perfect 50% splitter, Loss(dut)=X1−Y1
The measurement is independent of the input alignment error. These measurements can be done for in →n out device and a lossy splitter.

The deembedding measurements may include acceptable power thresholds to determine whether the DUT 60 is acceptable and independent of alignment error. The threshold can be based on the transfer function of the measured power and power loss at the DUT 60.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of testing a photonic integrated circuit (IC) comprising a test structure and a deembedding structure, the test structure comprising a test optical splitter, a test optical input coupled to an input of the test optical splitter, first and second test optical outputs coupled to respective first and second outputs of the test optical splitter, and a device under test (DUT) coupled between the first test optical output and the first output of the test optical splitter; the deembedding structure comprising a deembedding optical splitter, a deembedding optical input coupled to an input of the deembedding optical splitter, and first and second deembedding optical outputs coupled to respective first and second outputs of the deembedding optical splitter; the method comprising:

coupling a test probe device to the test optical input, first and second test optical outputs, the deembedding optical input, and first and second deembedding optical outputs;

operating the test probe device to make at least one test measurement related to the DUT, and at least one deembedding measurement; and processing the at least one test measurement and the at least one deembedding measurement to thereby determine whether the DUT is acceptable and independent of alignment error.

2. The method according to claim 1, wherein the photonic IC is among a plurality of photonic IC's contained on a semiconductor wafer.

3. The method according to claim 1, wherein operating the test probe device comprises transmitting an optical signal to the test optical input and the deembedding optical input.

4. The method according to claim 1, wherein operating the test probe device comprises receiving optical signals from the first and second test optical outputs and first and second deembedding optical outputs.

5. The method according to claim 1, wherein coupling the test probe device comprises coupling an array of optical fibers to respective grating couplers on the photonic IC.

6. The method according to claim 1, wherein the test optical splitter and deembedding optical splitter have a common splitting ratio.

7. The method according to claim 6, wherein the common splitting ratio is 50/50.

8. The method according to claim 1, wherein the photonic IC further comprises electronic circuitry coupled to the DUT.

9. A test probe device for testing a photonic integrated circuit (IC) comprising a test structure and a deembedding structure, the test structure comprising a test optical splitter, a test optical input coupled to an input of the test optical splitter, first and second test optical outputs coupled to respective first and second outputs of the test optical splitter, and a device under test (DUT) coupled between the first test optical output and the first output of the test optical splitter; the deembedding structure comprising a deembedding optical splitter, a deembedding optical input coupled to an input of the deembedding optical splitter, and first and second deembedding optical outputs coupled to respective first and second outputs of the deembedding optical splitter; the test probe device comprising:

a plurality of optical fibers to be temporarily coupled to the test optical input, first and second test optical outputs, the deembedding optical input, and first and second deembedding optical outputs;

at least one optical transmitter and a plurality of optical receivers coupled to the plurality of optical fibers and configured to make at least one test measurement related to the DUT, and at least one deembedding measurement; and a processor coupled to the at least one optical transmitter and plurality of optical receivers and being configured to process the at least one test measurement and the at least one deembedding measurement to thereby determine whether the DUT is acceptable and independent of alignment error.

10. The test probe device according to claim 9, wherein said processor cooperates with the at least one optical transmitter to transmit an optical signal to the test optical input and the deembedding optical input.

11. The test probe device according to claim 9, wherein said processor cooperates with said plurality of optical receivers to receive optical signals from the first and second test optical outputs and first and second deembedding optical outputs.

12. The test probe device according to claim 9, wherein said plurality of optical fibers are arranged in an array to be temporarily coupled to respective grating couplers on the photonic IC.

13. The test probe device according to claim 9, wherein the test optical splitter and deembedding optical splitter have a common splitting ratio.

14. The test probe device according to claim 13, wherein the common splitting ratio is 50/50.

15. The test probe device according to claim 9, wherein the photonic IC further comprises electronic circuitry coupled to the DUT.

16. A photonic integrated circuit (IC) comprising:

a test structure comprising a test optical splitter, a test optical input coupled to an input of the test optical splitter, first and second test optical outputs coupled to respective first and second outputs of the test optical splitter, and a device under test (DUT) coupled between the first test optical output and the first output of the test optical splitter; and a deembedding structure comprising a deembedding optical splitter, a deembedding optical input coupled to an input of the deembedding optical splitter, and first and second deembedding optical outputs coupled to respective first and second outputs of the deembedding optical splitter;

the test optical input, first and second test optical outputs, the deembedding optical input, and first and second deembedding optical outputs configured to be temporarily coupled to a test probe device to make at least one test measurement related to the DUT, and at least one deembedding measurement to thereby determine whether the DUT is acceptable and independent of alignment error.

17. The photonic IC according to claim 16, wherein the optical inputs and optical outputs each comprise a respective grating coupler.

18. The photonic IC according to claim 16, wherein the test optical splitter and deembedding optical splitter have a common splitting ratio.

19. The photonic IC according to claim 18, wherein the common splitting ratio is 50/50.

20. The photonic IC according to claim 16, further comprising electronic circuitry coupled to the DUT.

* * * * *

UNITED STATES PATENT AND TRADEMARK OFFICE
CERTIFICATE OF CORRECTION

PATENT NO. : 9,453,723 B1
APPLICATION NO. : 14/754747
DATED : September 27, 2016
INVENTOR(S) : LeMaitre et al.

It is certified that error appears in the above-identified patent and that said Letters Patent is hereby corrected as shown below:

| | |
|---|---|
| Title Page, Item (56), Other Publications | Insert --Luxtera Presentation, "Hybrid Silicon Photonics for High-Speed Optical Interconnect," July 24, 2014, Pages 1-24.-- |

Signed and Sealed this
Fifteenth Day of November, 2016

Michelle K. Lee
*Director of the United States Patent and Trademark Office*